(12) United States Patent
Kasargod et al.

(10) Patent No.: US 8,331,570 B2
(45) Date of Patent: Dec. 11, 2012

(54) METHOD AND SYSTEM FOR ENHANCING BASS EFFECT IN AUDIO SIGNALS

(75) Inventors: Sudhir K. Kasargod, Mysore (IN); Sapna George, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 13/073,599

(22) Filed: Mar. 28, 2011

(65) Prior Publication Data

US 2011/0176696 A1 Jul. 21, 2011

(30) Foreign Application Priority Data

Dec. 31, 2004 (SG) ................. 200407881-2

(51) Int. Cl.
*H04R 5/00* (2006.01)
*H03G 5/00* (2006.01)
*H04B 1/00* (2006.01)

(52) U.S. Cl. ............ 381/1; 381/98; 381/99; 381/17; 381/18; 381/19; 381/119

(58) Field of Classification Search .......... 381/1, 17–19, 381/119, 98, 99
See application file for complete search history.

(56) References Cited

U.S. PATENT DOCUMENTS

| | | | |
|---|---|---|---|
| 4,698,842 A | 10/1987 | Mackie et al. | |
| 5,930,373 A | 7/1999 | Shashoua et al. | |
| 6,134,330 A * | 10/2000 | De Poortere et al. | 381/61 |
| 6,285,767 B1 * | 9/2001 | Klayman | 381/17 |

OTHER PUBLICATIONS

Woon, et al., "Virtual Bass for Home entertainment Multimedia PC, Game Station and Portable Audio Systems," IEEE Transactions on Consumer Electronics, vol. 47, No. 4, Nov. 2001.

* cited by examiner

*Primary Examiner* — Devona Faulk
(74) *Attorney, Agent, or Firm* — Gardere Wynne Sewell LLP

(57) ABSTRACT

The quality of music output from audio systems is improved by simulating the effect of low frequency signals in the human ear. This thus allows listeners to perceive the lower frequency signals, even though the speakers may be incapable of providing such low frequency outputs. Method and systems provided for processing enhancing bass effect in audio signals. Said method and systems result in the bass enhancement being computationally less intensive. The bass effect enhancement techniques described are based on the response of sine and cosine transfer functions and on the directional independence of low frequency components. The human ear is unable to resolve directions from low frequency components. The bass effect enhancement technique alternatively is based on response of an exponential transfer function.

34 Claims, 6 Drawing Sheets

METHOD AND SYSTEM FOR ENHANCING BASS EFFECT IN AUDIO SIGNALS

PRIORITY CLAIM

This application is a divisional of U.S. application Ser. No. 11/280,952 filed Nov. 16, 2005, which claims priority from Singapore Patent Application No. 200407881-2 filed Dec. 31, 2004. Said applications are hereby incorporated by reference in their entirety.

TECHNICAL FIELD

The invention disclosed relates to a method and system for enhancing bass effect in audio signals. In particular, this invention relates to a method and system for enhancing bass effect of audio signals using low complexity non-linear saturating functions.

BACKGROUND

There have been many methods proposed for enhancing perception of bass content of audio signals. These methods vary from enhancing a certain band of frequencies to using amplitude modulation. Almost all of these methods are based on either temporal theory or place theory of pitch perception.

One method of bass enhancement generates consecutive harmonics for low frequency content of audio signals. Harmonic signals generated are modified according to a psycho-acoustic model and are output to the speakers. In this method, loudness modeling of the ear is used for adjusting amplitudes of the harmonics to match amplitude of the low frequency signal.

Another method of bass enhancement generates only even harmonics of the lower frequencies and a band of frequencies just above this bass frequency is enhanced to give a better bass effect.

Yet another, is based on the amplitude modulation of a carrier wave by the low frequency content of the audio signal. There is also a method based on generating frequency components such that the difference between adjacent partials approximates the frequency of the low frequency signal.

With advances in audio technology, audio systems are now not only able to reproduce music but also provide various audio-modes to listeners for listening to effects they desire. These audio-modes are helpful in creating musical effects the listeners want on the output of their audio systems. In some of these audio systems, there are options provided for specifically enhancing bass effect on the music. In this mode the system is expected to boost the bass frequency content of the system.

Some of the audio speakers of these audio systems are not able to reproduce low frequency spectrum efficiently. This is because of the limitation in size and other constraints of the audio speakers. As a result some of these audio systems, attenuate frequencies below 120 Hz. However, this disadvantageously prevents these audio systems from reproducing music effectively. In particular, some musical instruments examples of which are: drums and pianos have frequency components below 120 Hz.

Therefore, a need clearly exists for a method and system for enhancing bass effect of audio signals that overcome the problems or at least alleviate the limitations of existing systems.

SUMMARY

A method and system are provided for enhancing bass effect in audio signals using low complexity non-linear saturating functions.

Accordingly, provided herein is a method for enhancing bass effect of audio signals, the audio signals having a first input channel and a second input channel, comprising: extracting low frequency components of the first input channel and the second input channel; passing the low frequency components of the first input channel through a sine wave transfer function to produce a first output signal; passing the low frequency components of the second input channel through a cosine wave transfer function to produce a second output signal; filtering the first output signal and the second output signal by a band pass filter to produce a band filtered first output signal and a band filtered second output signal; adding the band filtered first output signal to the first input channel producing a resultant first output signal; and adding the band filtered second output signal to the second input channel producing a resultant second output signal. The extracting of low frequency components of the first input channel and the second input channel may produce low frequency components of the first input channel and the second input channel. The resultant first output signal and the resultant second output signal may be input to stereo speakers. During filtering, the first output signal and the second output signal may be limited to a predetermined frequency range. The sine wave transfer function is generally represented by $(i)=\sin(x(i))$, where x is the input signal, which is normalized, and y is the output normalized signal. The cosine wave transfer function is generally represented by $y(i)=\cos(x(i))$, where x is the input signal, which is normalized, and y is the output normalized signal. Adding the band filtered first output signal to the first input channel further comprises extracting high frequency components of the first input channel and adding the high frequency components to the band filtered first output signal. Adding the band filtered second output signal to the second input channel may further comprise extracting high frequency components of the second input channel and the adding the high frequency components to the band filtered second output signal. Extracting may further comprises attenuating the low frequency components of the first input channel and the second input channel.

In addition, provided herein is a system for enhancing bass effect of audio signals, the audio signals having a first input channel and a second input channel, comprising: a first low pass filter configured to receive signals from the first input channel; a second low pass filter configured to receive signals from the second input channel; a sine function block coupled to an output of the first low pass filter and configured to produce a first output signal; a cosine function block coupled to an output of the second low pass filter and configured to produce a second output signal; and a band pass filter configured to limit the frequency range of the first output signal and the second output signal and produce a filtered first output signal and a filtered second output signal. The system may further comprise a high pass filter for extracting high frequency components of the first input channel and the second input channel. The extracted components may be added to the filtered first output signal and the filtered second output signal. The system may further comprise an input source for receiving the first and second output signal. The input source may be stereo speakers. The system may further comprise an attenuator for attenuating the low frequency components of the first input channel and the second input channel.

Also disclosed is a method for enhancing bass effect of audio signals, the audio signals having a first input channel and a second input channel, comprising: extracting low frequency components from the first input channel; extracting low frequency components from the second input channel; passing the low frequency components of the first input channel through a sine wave transfer function; passing the low frequency components of the second input channel through a cosine wave transfer function; bandpass filtering the first output signal to produce a band filtered first output signal; bandpass filtering the second output signal to produce a band filtered second output signal; adding the band filtered first output signal to the first input channel producing a resultant first output signal; and adding the band filtered second output signal to the second input channel producing a resultant second output signal. Adding the band filtered first output signal to the first input channel may further comprise extracting high frequency components of the first input channel and adding the high frequency components to the band filtered first output signal. Adding the band filtered second output signal to the second input channel may further comprise extracting high frequency components of the second input channel and the adding the high frequency components to the band filtered second output signal. Extracting low frequency components from the first input channel may further comprise attenuating the low frequency components of the first input channel. Extracting low frequency components from the second input channel may further comprise attenuating the low frequency components of the second input channel. The sine wave transfer function is represented by $y(i)=\sin(x(i))$, where x is the input signal which is normalized; and y is the output normalized signal. The cosine wave transfer function is represented by $y(i)=\cos(x(i))$, where x is the input signal which is normalized; and y is the output normalized signal.

Also provided is a system for enhancing bass effect of audio signals, the audio signals having a first input channel and a second input channel, comprising: a low pass filter configured to receive the first and second input channels and extract low frequency components of the first and second input channels; a circuit operable to pass each of the low frequency components of the first and second input channels through a sinusoidal wave transfer function to produce a first output signal and a second output signal; a band pass filter configured to limit frequency range of the first output signal and the second output signal to a predetermined frequency range and respectively produce a band filtered first output signal and a band filtered second output signal; a mixer configured to add the band filtered first output signal to the first input channel; and a mixer configured to add the band filtered second output signal to the second input channel. The circuit may include a sine function block for receiving low frequency components of the first input channel and producing the first output signal and a cosine function block for receiving low frequency components of the second input channel and producing the second output signal. The sine function block is represented by $y(i)=\sin(x(i))$, where x is the input signal which is normalized; and y is the output normalized signal. The cosine function block is represented by $y(i)=\cos(x(i))$, where x is the input signal which is normalized; and y is the output normalized signal. The system may further comprise at least one a high pass filter adapted to extract high frequency components of the first input channel and the second input channel before addition to the band filtered first output signal and the band filtered second output signal. The system may further comprise at least one attenuator adapted to attenuate the low frequency components of the first input channel and the second input channel.

Still further is provided a method for enhancing bass effect of audio signals, the audio signals having input channels, comprising: extracting low frequency components from the input channels, wherein content of each input channel is not independent; passing extracted low frequency components through sinusoidal wave transfer functions; filtering the extracted low frequency components; mixing the extracted low frequency components; wherein for each input channel operations are performed separately. The extracting includes low pass filtering each input channel separately. Mixing comprises separately mixing filtered output of each input channel with original signals feeding into each input channel. During operation output from each input channel remains separate. The method further comprises providing resultant output signals to input channels of at least one audio speaker. Generally, extracting low frequency components from each input channel occurs simultaneously. The input channels are generally stereo channels. The sinusoidal wave transfer functions include a sine wave transfer function for at least a first input channel and a cosine wave transfer function for at least a second input channel.

BRIEF DESCRIPTION OF THE DRAWINGS

Embodiments will now be more fully described, by way of example, with reference to the drawings of which.

DETAILED DESCRIPTION OF THE DRAWINGS

Figure 1:
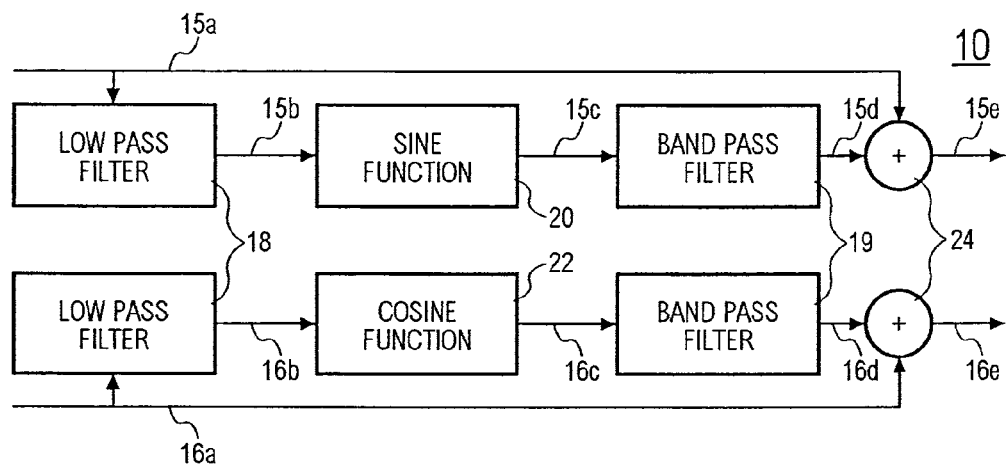
FIG. 1 illustrates a functional block diagram of a system according to a first embodiment.

In the following description, details are provided to describe embodiments of the invention. It shall be apparent to one skilled in the art, however, that the embodiments may be practiced without such details. Some of these details may not be described at length so as not to obscure the preferred embodiments.

The embodiments can be used to improve the quality of music output from audio systems by simulating the effect of low frequency signals in the human ear. This thus allows listeners to perceive the lower frequencies signals, even though the speakers may be incapable of providing such low frequency outputs. The embodiments provide simple methods for enhancing bass effect of audio signals for enhanced perception. The simple methods also result in the processing of bass content being computationally less intensive.

Certain concepts pertaining to human hearing are further discussed to provide background regarding the embodiments. They are: temporal theory of human hearing, phenomenon of missing fundamental and the directional independence of low frequency components.

Temporal Theory of Human Hearing

The temporal theory of the human auditory system suggests that the pitch of a sound stimulus is related to the time pattern of the neural impulses evoked by that stimulus. Nerve firings tend to occur at a particular phase of a stimulating waveform. Thus, time intervals between successive spikes approximate integer multiples of the period of the stimulating waveform. Pitch is thus related to the time pattern of these nerve impulses. The temporal theory only applies to low frequencies and cannot work for frequencies above 4000 or 5000 Hz.

Thus when a complex sound waveform is exposed to the human ear; according to the temporal theory, the human ear will be able to perceive sounds of different pitches. These pitches might have been the result of interaction of several partials present in the complex sound signal. The pitch associated with the complex sound waveform would be the one to which attention is most strongly drawn by virtue of its loudness or of its contrast with previous sounds.

Non-Linear Saturation

When an input waveform is passed through a block which saturates the input in a gradual manner, an output waveform of this block will not only have the original frequency, but will also contain other frequency components. The frequency components present in the output waveform depends on the frequencies present in the input waveform and the configuration of the saturating curve. The non-linear curve does not treat the entire amplitude range in a similar way.

In other words, the gain of the curve depends on the amplitude range of the signal. Thus when an input waveform is normalized and passed through a block which does gradual saturation, it is equivalent to passing the input waveform through a non-linear curve. This results in an output waveform, which has other frequency components which are directly related to the frequencies present in the input waveform.

Directional Independence of Low Frequency Components

Low frequency components of music signals are found to have no directionality. This means that the direction from which the low frequency components of the music are coming from are not critical to the human ear. This is likely due to the fact that human ears are separated by a relatively short distance, resulting in the inability of the human brain to distinguish the direction from which the low frequency sound is coming from.

The bass effect enhancement described in several embodiments are based on a response of sine and cosine transfer functions and on the directional independence of low frequency components. The human ear is unable to resolve directions from low frequency components. The bass effect enhancement described in an additional embodiment is based on response of a exponential transfer function.

First Embodiment

Referring to FIG. 1, a representative system 10 for enhancing bass effect in audio signals in accordance with a first embodiment is shown. The system 10 is applicable for stereo channels, as an example. During processing, the contents of the channels are performed separately. This assumes that the low frequency content in each of the channels are not totally independent of each other.

The system 10 comprises low pass filters 18 for extracting low pass frequency components from at least a first input channel 15a and at least a second input channel 16a. The at least two input channels being stereo channels. The system 10 further comprises a sine function block 20 and a cosine function block 22, both of which are coupled to band pass filters 1. The resulting output of the bandpass filters 19, are respectively added to at least the first input channel 15a and/or the second input channel 16a via one or more mixers 24.

In operation, the method for enhancing bass effect in audio signals of the first embodiment as represented by FIG. 1 starts with extracting low frequency components 15b from the first input channel 15a using the low pass filter 18. The low-frequency components 15b of the first input channel 15a are passed through a sinusoidal wave transfer functions, such as sine function block 20. The sine function block 20 generates a first output signal 15c, having frequencies of which are dependent on the signal frequencies of the first input channel 15a.

The first output signal 15c undergoes filtering by a band pass filter 19. The band pass filter limits the frequency of harmonics from the first output signal 15c to a predetermined frequency range to produce a band filtered first output signal 15d. The band filtered first output signal 15d is generally added to the original contents of the first input channel 15a via mixer 24 producing a resultant first output signal 15e. The resultant first output signal 15e is sent as input to at least one of the stereo input channels of at least one audio speaker.

The second input channel 16a is simultaneously and similarly processed. The method simultaneously extracts low pass frequency components 16b from at least one second input channel 16a using the low pass filter 18. The low-frequency components 16b of the at least one second input channel 16a are passed through a sinusoidal wave transfer functions, such as cosine function block 22. The cosine function block 22 generates a second output signal 16c, having frequencies of which are based on the signal frequencies of the at least one second input channel 16a.

The second output signal 16c undergoes filtering by the band pass filter 19. The band pass filter limits the frequencies present in the first output signal 16c to a predetermined frequency range to produce a band filtered second output signal 16d. The band filtered second output signal 16d is generally added to the original contents of the second input channel 16a via mixer 24 producing a resultant second output signal 16e. The resultant second output signal 16e is sent as input to at least one of the stereo input channels of at least one audio speaker.

As described, with a method of the first embodiment, the resultant first output signal 15e will, in one form, have the original contents of the first input channel 15a together with the filtered output of the sinusoidal wave transfer function (e.g., sine function block 20 for FIG. 1). The resultant second output signal 16e will, in one form, have the original contents of the second input channel 16a of the input audio signal together with the filtered output of the sinusoidal wave transfer function (e.g., cosine function block 22 for FIG. 1). This provides an enhancement to the bass effect of the audio signals.

Second Embodiment

Figure 2:
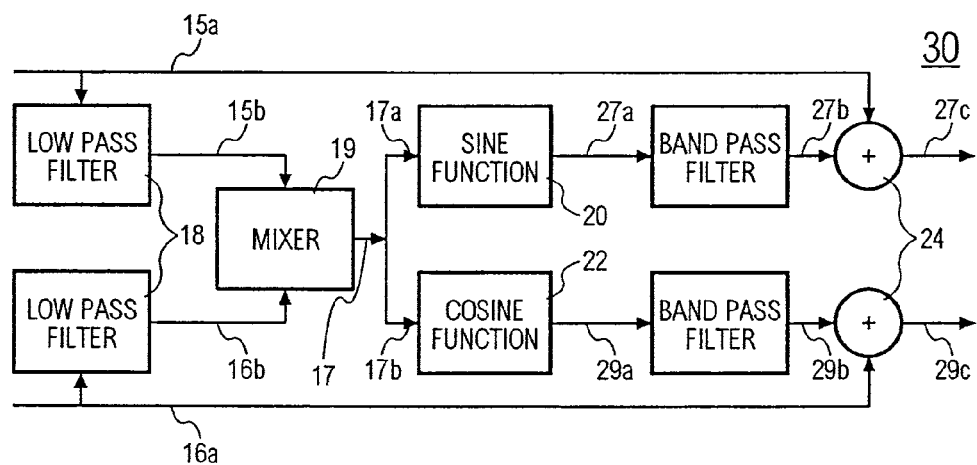
FIG. 2 illustrates a functional block diagram of a system according to a second embodiment.

Referring to FIG. 2, a representative system 30 for enhancing bass effect in audio signals in accordance with a second embodiment is shown. The system 30 is basically applicable for stereo channels and the output of the processing is at least a two channel audio output.

The system 30 similarly comprises low pass filters 18 for extracting low frequency components 15b, 16b from the first input channel 15a and the second input channel 16a. The two input channels being stereo channels. The system 30 further comprises an initial mixer block 19, a sine function block 20 and a cosine function block 22, both filters being coupled to the band pass filters 18. The resulting output of the bandpass filters 18 are respectively added to the first input channel 15a and the second input channel 16a via mixers 24.

In operation, the method for enhancing bass effect in audio signals of the second embodiment includes extracting low pass frequency components 15b, 16b from the first input channel 15a and the second input channel 16a using the low pass filters 18. The low-frequency components 15b of the first input channel 15a and the low frequency components 16b of the second input channel 16a are added together in the initial mixer block 19, producing an initial audio stream 17.

The initial audio stream 17 is split into a first audio stream 17a and a second audio stream 17b.

The first audio stream 17a is passed through the sine function block 20. The sine function block 20 generates a first output signal 27a, the frequencies of which are dependent on the signal frequency of the first input channel 15a.

The second audio stream 17b is passed through the cosine function block 22. The cosine function block 22 generates a second output signal 29a, having frequencies of which are dependent on the signal frequency of the first input channel 16a.

The first output signal further 27a undergoes filtering by a band pass filter 19. The band pass filter limits the frequency of harmonics from the first output signal 27a to a predetermined frequency range to produce a band filtered first output signal 27b. The band filtered first output signal 27b is then added to the original contents of the first input channel 15a via the mixer 24 producing a resultant first output signal 27c. The resultant first output signal 27c is then sent as input to one of the stereo input channels of an audio speaker.

Simultaneously, the second output signal further 29a undergoes filtering by a band pass filter 19. The band pass filter 19 limits the frequency of harmonics from the second output signal 29a to a predetermined frequency range to produce a band filtered second output signal 29b. The band filtered first output signal 29b is then added to the original contents of the second input channel 16a via the mixer 24 producing a resultant second output signal 29c. The resultant second output signal 29c is then sent as input to one of the stereo input channels of the audio speaker.

In this method of the second embodiment, the resultant first output signal 27c will have the original contents of the first input channel 15a along with the filtered output of the sine function block 20. The resultant second output signal 29c will have the original contents of the second input channel 16a of the input audio signal along with the filtered output of the cosine function block 22.

In both the first and second embodiment, the audio speakers will output the resultant first output signal 15e, 27c and the resultant second output signal 16e, 29c. Since the human ear is unable to distinguish the direction from which the low frequencies signals come from. The combination of the resultant first output signal 15e, 27c and the resultant second output signal 16e, 29c will provide an enhancement to the bass effect of the audio signals.

Third Embodiment

The system and method of the third embodiment is utilizes the fact that a multiple tone wave passed through an exponential transfer function results in an output wave having multiple frequencies, which are multiples of input frequencies as well as sum and difference components of the input sinusoidal frequencies and its harmonics. The combined effect of all these frequencies will give the same acoustical effect as the original input wave to the system.

The bass effect enhancement method of the third embodiment may be applied on both mono as well as stereo input signals. The third embodiment involves low pass filtering, passing through an exponential transfer function to generate harmonic frequencies and sum and difference frequencies. A band pass filter is also used to limit the range of the frequency components.

Figure 3:
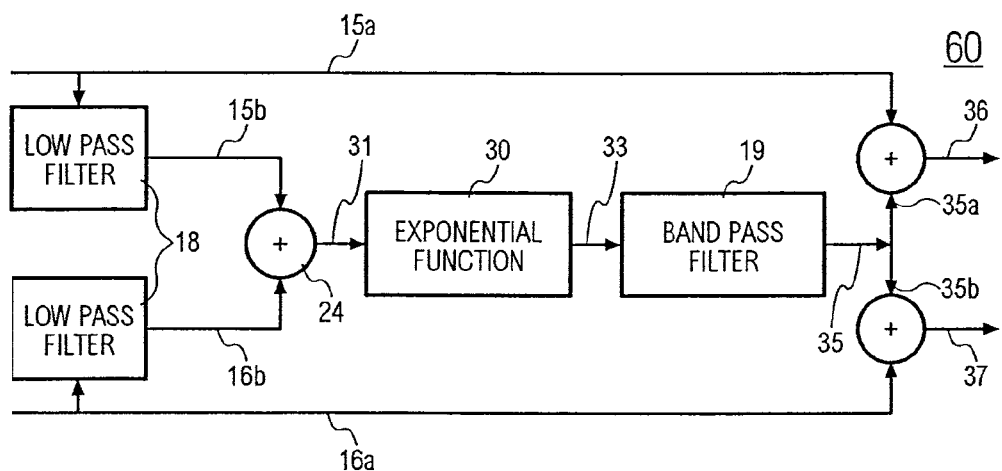
FIG. 3 illustrates a functional block diagram of a system according to a third embodiment.

Referring to FIG. 3, the representative system 60 of the third embodiment comprises low pass filters 18 for extracting low pass frequencies from a first input channel 15a and a second input channel 16a. The two input channels being stereo channels. The system 60 further comprises mixers 24 and an exponential function block 30, which is coupled to a band pass filter 19. The resulting output of the bandpass filter 19 is split and added to the first input channel 15a and the second input channel 16a via the mixers 24.

In operation, the method for enhancing bass effect in audio signals of the third embodiment includes extracting low frequency components 15b, 16b from the first input channel 15a and the second input channel 16a using the low pass filters 18. The low-frequency components 15b of the first input channel 15a and the low frequency components 16b of the second input channel 16a are added together in a mixer 24, producing a down-mixed single audio stream 31.

The step of passing the down-mixed single audio stream 31 through the exponential function block 30 is performed to generate an output signal 33.

The output signal 33 undergoes filtering by a band pass filter 19. The band pass filter limits the frequency from the output signal 33 to a predetermined frequency range to produce a band filtered output signal 35. The band filtered output signal 35 is then split into a first band filtered output signal 35a and a second band filtered output signal 35b.

The first band filtered output signal 35a is added to the original contents of the first input channel 15a via a mixer 24 producing a first resultant output signal 36. The second band filtered output signal 35b is added to the original contents of the second input channel 16a via a mixer 24 producing a second resultant output signal 37.

The first resultant output signal 36 and the second resultant output signal 37 are sent as input to the stereo input channels of audio speakers.

Figure 4:
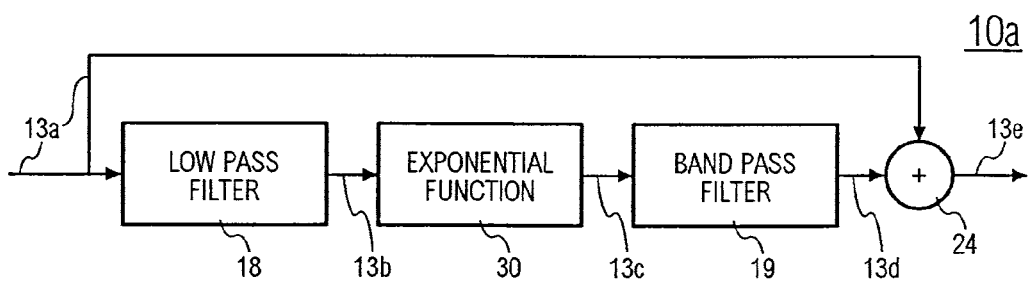
FIG. 4 illustrates a functional block diagram of a system according to a mono version of the third embodiment.

Referring to FIG. 4, the system 60 and method of the third embodiment may be easily adapted for catering to mono input of audio signals. The system 60a for mono input of audio signals in accordance with the third embodiment comprises a single mono input channel 13a, the exponential function block 30 coupled to the low pass filter 18 and the band pass filter 19.

In operation, the method for enhancing bass effect in audio signals for mono input in accordance with the third embodiment starts with the step of extracting low frequency components 13b from the mono input channel 13a using the low pass filter 18.

Passing the low frequency components 13b from the mono input channel 13a through the exponential function block 30 is performed to generate an output signal 13c.

The output signal 13c undergoes filtering by the band pass filter 19. The band pass filter 19 limits the frequency from the output signal 13c to a predetermined frequency range to produce a band filtered output signal 13d.

The band filtered output signal 13d is then added to the original contents of the mono input channel 13a via mixer 24 producing a resultant output signal 13e.

The resultant output signal 13e is then sent as input to a mono input channel of audio speakers.

Sine Function Block

The Sine function block 20 transforms the input by passing it through a sine wave transfer function. The input to this block are the outputs of the low pass filter 18 and hence consists of only low frequency components of the audio signal. When the low frequency components of the audio signal are passed through this sine function block 20, the output of the sine wave transfer function will have frequency components which are directly related to the input frequency components.

$$y(i)=\sin(x(i)) \quad \text{Eqn. 1}$$

Where, x is the input signal which is normalized and y is the output normalized signal.

Eqn. 1 given above shows the sine wave transfer function present in this block. The output vector y is basically derived after passing the input vector x through a non linear sine wave transfer function.

Cosine Function Block

The Cosine function block 22 transforms input by passing it through a cosine wave transfer function. The input to this block is the output of the low pass filter 18 and will consist of only low frequency components of the audio signal. When the low frequency components are passed through this cosine wave function block 22, the output of the cosine transfer function will have frequency components which are directly related to the input frequency components.

$$y(i)=\cos(x(i)) \quad \text{Eqn. 2}$$

Eqn. 2 given above shows the transfer function present in this block. The output vector y is basically derived after passing the input vector x through a non linear cosine wave transfer function.

Exponential Function Block

The Exponential function block 30 transforms input by passing it through a exponentially curved transfer function. The input to this block 30 is the output of the low pass filter 18 and hence it consists of only low frequency components of the audio signal. When the low frequency components of the audio signal are passed through this exponential function block 30, the output of this block will have new frequency components which are directly related to the input frequency components.

$$y(i)=\exp(x(i)) \quad \text{Eqn. 3}$$

Eqn. 3 given above shows the transfer function present in this block. The output vector y is basically derived after passing the input vector x through a non linear exponentially saturating transfer function.

Initial Mixer Block

The initial mixer block 19 is responsible for mixing of the contents of the first input channel 15a and the second input channel 16a in the second embodiment. The initial mixer block 19 allows a user to control the percentage of the content of each input channel 15a, 16a in the resultant output signals 15e, 16e. The initial mixer block 19 mixes the contents of the two input channels 15a, 16a weighted by weights w1 and w2 as specified by the user. Eqn. 4 given below specifies how the mixer channel output is obtained.

$$q(i)=w1*l(i)+w2*r(i) \quad \text{Eqn. 4}$$

Where, l(i) is the content in audio channel 1, r(i) is the content in audio channel 2, and w1 and w2 are the user specified scaling factors subjected to the constraint. And where, $$w1+w2=1. \quad \text{Eqn. 5}$$

Simulations

Figure 5:
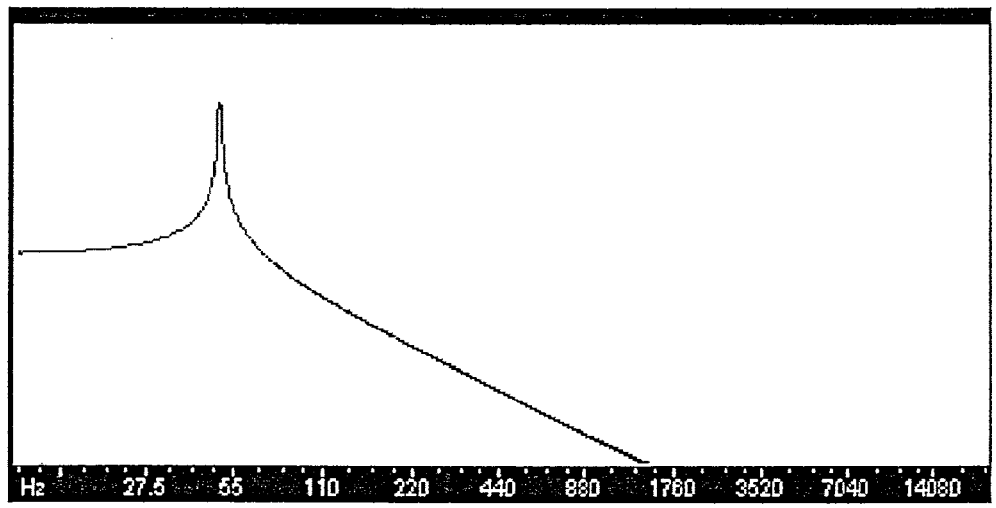
FIG. 5 illustrates a frequency plot of an input signal having a 50 Hz frequency component.
Figure 6:
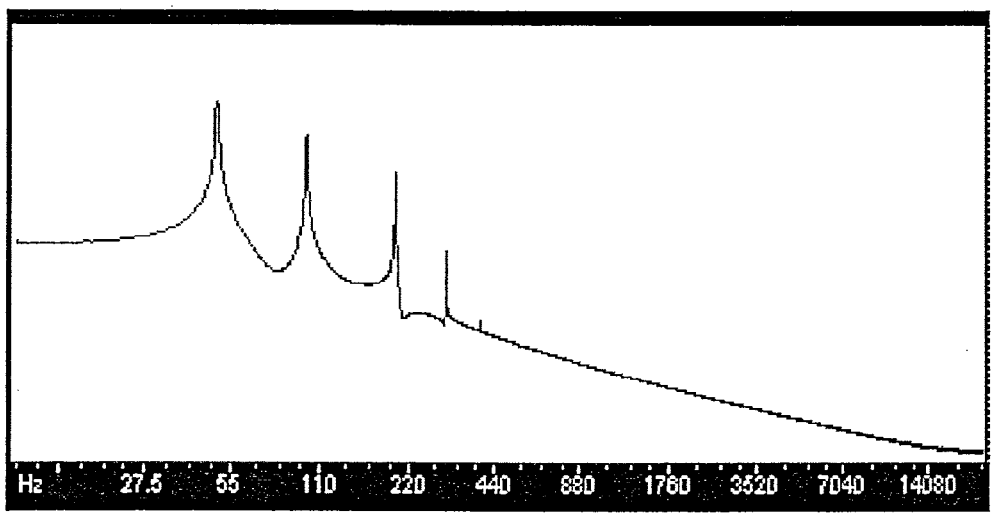
FIG. 6 illustrates a frequency domain plot of a resultant first output signal of the first and second embodiment having an input as shown in FIG. 5.
Figure 7:
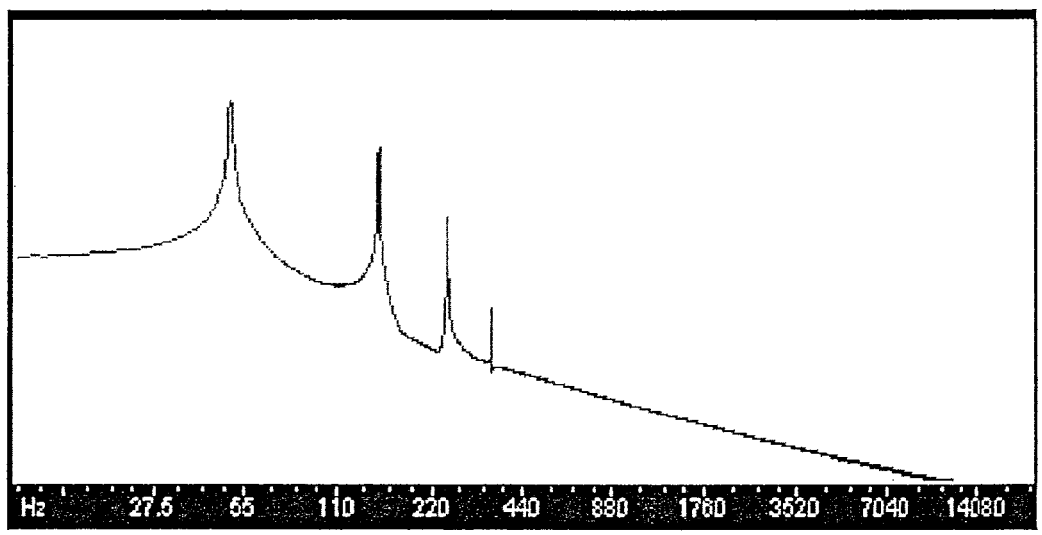
FIG. 7 illustrates a frequency domain plot of a resultant second output signal of the first and second embodiment having an input as shown in FIG. 5.

A first simulation was performed using a simple 50 Hz sine wave as input to both input channels 15a, 16a of the system 10, 30 of the first and second embodiment. Referring to FIG. 5, a frequency domain plot of the input waveform is shown. Referring to FIG. 6 and FIG. 7 the frequency domain plots of the resultant output waveforms of the system 10, 30 for the resultant first output signal 15e, 27c and the resultant second output signal 16e, 29c are shown respectively.

Referring to FIG. 5, the input waveform has only one component at 50 Hz. Referring to FIG. 6, the resultant first output signal 15e, 27c comprises the original signal component at 50 Hz and the $2^{nd}$, $4^{th}$ and $6^{th}$ harmonics (even) of the input waveform.

Referring to FIG. 7, the resultant second output signal 16e, 29c comprises of the original signal component at 50 Hz and the $3^{rd}$, $5^{th}$ and $7^{th}$ harmonics (odd) of the input waveform.

Figure 8:
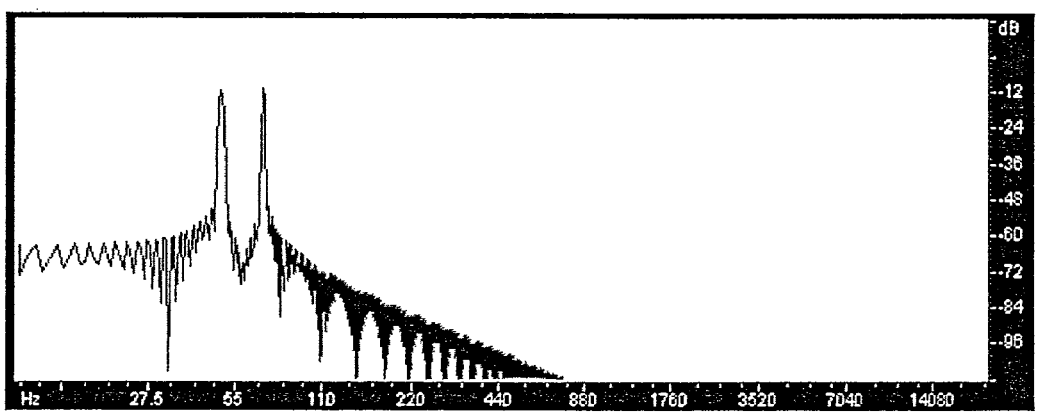
FIG. 8 illustrates a frequency domain plot of an input signal having a 50 Hz and 70 Hz frequency component.
Figure 9:
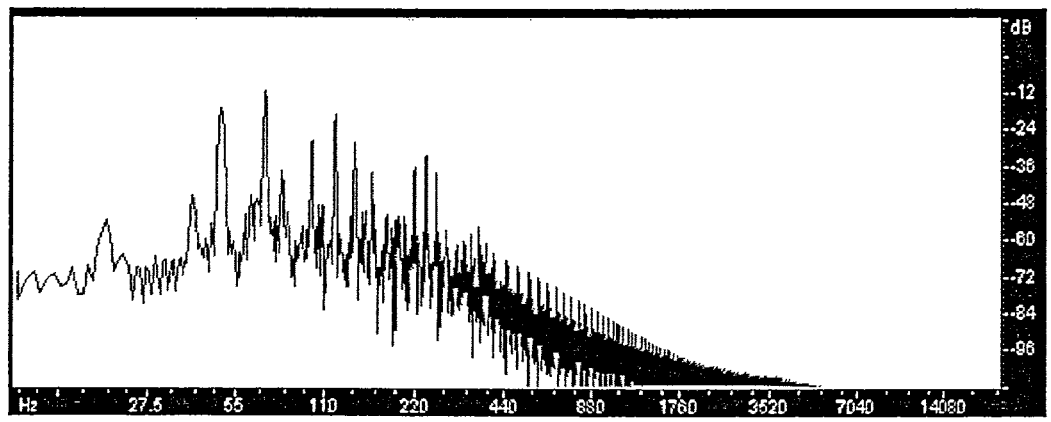
FIG. 9 illustrates a frequency domain plot of a resultant first output signal of the first and second embodiment having an input as shown in FIG. 8.

A second simulation was performed using an input waveform containing frequency components at 50 and 70 Hz as shown in FIG. 8. Referring to FIG. 9, the resultant first output signal 15e, 27c comprises the original signal component at 50 Hz and 70 Hz together with frequency components at 100, 120, 140, 160, 220, 140 and 160 Hz.

Figure 10:
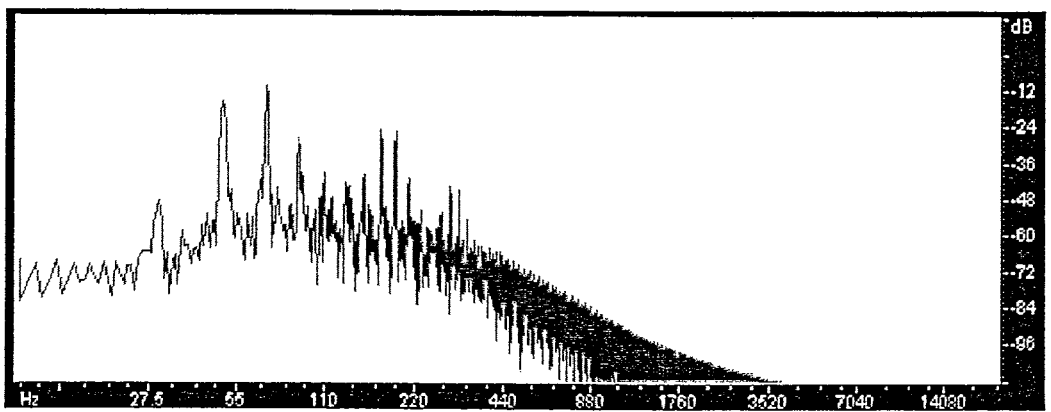
FIG. 10 illustrates a frequency domain plot of a resultant second output signal of the first and second embodiment having an input as shown in FIG. 8.

Referring to FIG. 10, a resultant second output signal 15e, 27c comprises the original signal component at 50 Hz and 70 Hz together with frequency components at 150, 170, 190, 210, 290 and 310 Hz.

A third simulation was performed using an input audio signal having frequency components at 50 Hz and 75 Hz for input into the system 60, 60a in accordance with the third embodiment.

Figure 11:
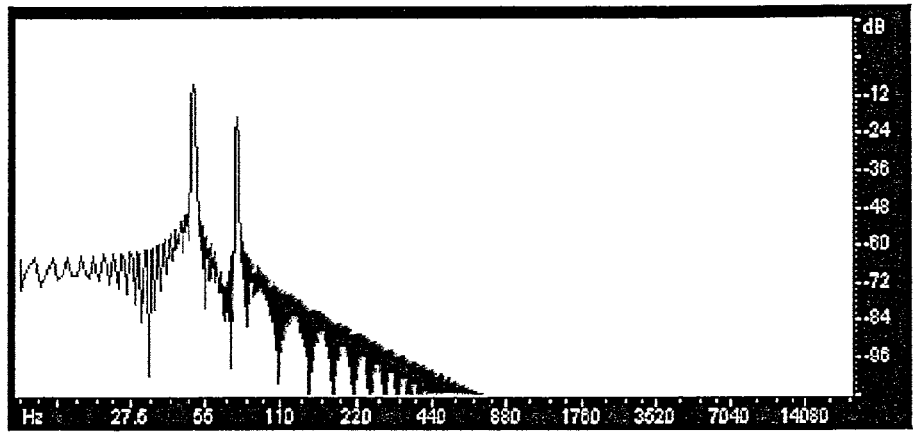
FIG. 11 illustrates a frequency domain plot of an input signal having 50 Hz and 75 Hz frequency components.

Referring to FIG. 11, a frequency domain plot of the input audio signal is shown.

Referring to FIG. 6 and FIG. 7 the frequency domain plots of the resultant output waveforms of the system 10, 30 for the resultant first output signal 15e, 27c and the resultant second output signal 16e, 29c are shown respectively.

Figure 12:
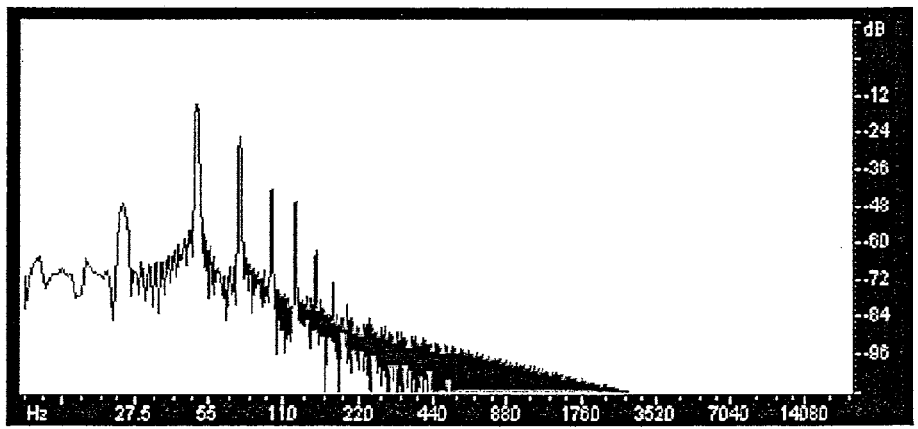
FIG. 12 illustrates a frequency domain plot of a resultant output signal of the third embodiment having an input as shown in FIG. 1.

When this input audio signal is input to the exponential function block 30, the output of the block is as shown in FIG. 12. It can be seen that the output has frequency components at 100 Hz (Harmonic of 50 Hz), 125 Hz (75+50 Hz), 150 Hz (Harmonic of 75 Hz), 25 Hz (75−50 Hz) and the original frequency components at 50 Hz and 75 Hz.

It can be seen that in response to the input signal which consisted of 2 sinusoidal frequencies, the output comprises sinusoidal frequencies at 25 Hz, 50 Hz, 75 Hz, 100 Hz, 125 Hz, 150 Hz and 175 Hz.

Some additional modifications for further improving on the described embodiments are possible. For example, there may be the addition of one or more high pass filters to the systems (e.g., 10, 30, 60, 60a) to extract high frequency components of one or more input channels (e.g., 15a, 16a, 13a) before adding one or more of them to the band filtered output signals (e.g., 15d, 16d, 27b, 29b, 35a, 35b, 13d) to thereby produce resultant output signals (e.g., 15e, 16e, 27c, 29c, 36, 37, 24).

Another exemplary modification includes adding an attenuator to attenuate the low frequency components (e.g., 15b, 16b, 13b) of the input channels (e.g., 15a, 16a, 13a) before further processing.

It will be appreciated that although various embodiments have been described in detail, additional modifications and improvements may be made by a person skilled in the art without departing from the scope of the present invention.

What is claimed is:

1. A method for enhancing bass effect in audio signals, the audio signals having a first input channel and a second input channel, the method comprising:
    extracting low frequency components from the first input channel and the second input channel;
    passing the low frequency components of the first input channel through a sine wave transfer function to produce a first output signal;
    passing the low frequency components of the second input channel through a cosine wave transfer function to produce a second output signal;
    filtering the first output signal and the second output signal to produce a filtered first output signal and a filtered second output signal;
    adding the filtered first output signal to the first input channel producing a resultant first output signal; and
    adding the filtered second output signal to the second input channel producing a resultant second output signal.

2. The method of claim 1, wherein during filtering the first output signal and the second output signal are limited to a predetermined frequency range.

3. The method of claim 1, wherein the resultant first output signal and the resultant second output signal are input to stereo speakers.

4. The method of claim 1, wherein the sine wave transfer function is represented by:

$$y(i)=\sin(x(i)),$$

where x is the input signal, which is normalized, and y is the output normalized signal.

5. The method of claim 1, wherein the cosine wave transfer function is represented by:

$$y(i)=\cos(x(i)),$$

where x is the input signal, which is normalized, and y is the output normalized signal.

6. The method of claim 1, wherein adding the filtered first output signal to the first input channel further comprises extracting high frequency components of the first input channel and adding the high frequency components to the filtered first output signal.

7. The method of claim 1, wherein adding the filtered second output signal to the second input channel further comprises extracting high frequency components of the second input channel and the adding the high frequency components to the filtered second output signal.

8. The method of claim 1, wherein extracting further comprises attenuating the low frequency components extracted from ef the first input channel and the second input channel.

9. A system for enhancing bass effect in audio signals, the audio signals having a first input channel and a second input channel, comprising:
    a first low pass filter configured to receive signals from the first input channel;
    a second low pass filter configured to receive signals from the second input channel;
    a sine function block coupled to an output of the first low pass filter and configured to produce a first output signal;
    a cosine function block coupled to an output of the second low pass filter and configured to produce a second output signal;
    a first filter and a second filter configured to limit the frequency range of the first output signal and the second output signal, respectively, and produce a filtered first output signal and a filtered second output signal.

10. The system of claim 9 further comprising a first and second high pass filter configured to extract high frequency components of the first input channel and the second input channel, respectively.

11. The system of claim 10 further comprising a first adder and a second adder configured to add extracted high frequency components to the filtered first output signal and the filtered second output signal, respectively.

12. The system of claim 9 further comprising a device configured to receive the first and second output signal.

13. The system of claim 12, wherein the device is stereo speakers.

14. The system of claim 9 further comprising a first attenuator and a second attenuator configured to attenuate outputs of the first low pass filter and the second low pass filter, respectively.

15. A method for enhancing bass effect in audio signals, the audio signals having a first input channel and a second input channel, the method comprising:
    extracting low frequency components from the first input channel;
    extracting low frequency components from the second input channel;
    passing the low frequency components of the first input channel through a sine wave transfer function;
    passing the low frequency components of the second input channel through a cosine wave transfer function;
    bandpass filtering the first output signal to produce a band filtered first output signal;
    bandpass filtering the second output signal to produce a band filtered second output signal;
    adding the band filtered first output signal to the first input channel producing a resultant first output signal; and
    adding the band filtered second output signal to the second input channel producing a resultant second output signal.

16. The method of claim 15, wherein adding the band filtered first output signal to the first input channel further comprises extracting high frequency components of the first input channel and adding the high frequency components to the band filtered first output signal.

17. The method of claim 15, wherein adding the band filtered second output signal to the second input channel further comprises extracting high frequency components of the second input channel and the adding the high frequency components to the band filtered second output signal.

18. The method of claim 15, wherein extracting low frequency components from the first input channel further comprises attenuating the extracted low frequency components of the first input channel.

19. The method of claim 15, wherein extracting low frequency components from the second input channel further comprises attenuating the extracted low frequency components of the second input channel.

20. The method of claim 15, wherein the sine wave transfer function is represented by:

$$y(i)=\sin(x(i))$$

where, x is the input signal which is normalized; and y is the output normalized signal.

21. The method of claim 15, wherein the cosine wave transfer function is represented by:

$$y(i)=\cos(x(i))$$

where, x is the input signal which is normalized; and y is the output normalized signal.

22. A system for enhancing bass effect in audio signals, the audio signals having a first input channel and a second input channel, the system comprising:
- a first low pass filter and a second low pass filter configured to receive the first and second input channels, respectively, and extract low frequency components of the first and second input channels;
- a first circuit configured to pass each of the low frequency components of the first and second input channels through a sinusoidal wave transfer function and respectively produce a first output signal and a second output signal;
- a band pass filter configured to limit frequency range of each of the first output signal and the second output signal to a predetermined frequency range and respectively produce a band filtered first output signal and a band filtered second output signal;
- a second circuit configured to add the band filtered first output signal to the first input channel; and
- a third circuit configured to add the band filtered second output signal to the second input channel.

23. The system of claim 22, wherein the first circuit includes a sine function block configured to receive low frequency components of the first input channel and produce the first output signal and a cosine function block configured to receive low frequency components of the second input channel and produce the second output signal.

24. The system of claim 22 further comprising at a first and second high pass filter configured to extract high frequency components of the first input channel and the second input channel, respectively, before addition to the band filtered first output signal and the band filtered second output signal.

25. The system of claim 22 further comprising a first and second attenuator configured to attenuate the low frequency components of the first input channel and the second input channel, respectively, that are output from the first and second low pass filters.

26. The system of claim 23, wherein the sine function block is represented by:

$$y(i)=\sin(x(i)),$$

where x is the input signal, which is normalized, and y is the output normalized signal.

27. The system of claim 23, wherein the cosine function block is represented by:

$$y(i)=\cos(x(i)),$$

where x is the input signal, which is normalized, and y is the output normalized signal.

28. A method for enhancing bass effect in audio signals, the audio signals having first and second input channels, the method comprising:
- extracting first and second low frequency components from the first and second input channels;
- passing extracted first and second low frequency components through separate first and second sinusoidal wave transfer functions;
- separately filtering the extracted low frequency components; and
- separately mixing the extracted low frequency components.

29. The method of claim 28, wherein extracting includes separately low pass filtering the first and second input channels.

30. The method of claim 28, wherein separately mixing comprises separately mixing filtered extracted low frequency components of each input channel with the audio signals of each input channel.

31. The method of claim 28 further comprising providing resultant output signals to input channels of a stereo speaker.

32. The method of claim 28, wherein extracting low frequency components from each input channel occurs simultaneously.

33. The method of claim 28, wherein the input channels are stereo channels.

34. The method of claim 28, wherein the first and second sinusoidal wave transfer functions include a sine wave transfer function for at least a first input channel and a cosine wave transfer function for at least a second input channel.

* * * * *

UNITED STATES PATENT AND TRADEMARK OFFICE
CERTIFICATE OF CORRECTION

PATENT NO. : 8,331,570 B2
APPLICATION NO. : 13/073599
DATED : December 11, 2012
INVENTOR(S) : Sudhir Kumar Kasargod et al.

It is certified that error appears in the above-identified patent and that said Letters Patent is hereby corrected as shown below:

On the Title Page, please add Item (62)

Related U.S. Application Data

(62) Division of application No. 11/280,952, filed on Nov. 16, 2005, now Pat. No. 7,961,888.

At column 11, claim 8, line number 55, please delete the word "ef".

At column 13, claim 24, line number 27, please delete the word "at".

Signed and Sealed this
Fifth Day of February, 2013

Teresa Stanek Rea
*Acting Director of the United States Patent and Trademark Office*